(12) United States Patent
Wittkowski (10) Patent No.: US 8,022,696 B2
(45) Date of Patent: Sep. 20, 2011

(54) MAGNETIC FIELD SENSING ELEMENT HAVING MAGNETIC NANOPARTICLES

(75) Inventor: Thomas Wittkowski, Hermeskeil (DE)

(73) Assignee: IEE International Electronics & Engineering S.A., Luxembourg (LU)

( * ) Notice: Subject to any disclaimer, the term of this patent is extended or adjusted under 35 U.S.C. 154(b) by 461 days.

(21) Appl. No.: 12/162,384

(22) PCT Filed: Jan. 25, 2007

(86) PCT No.: PCT/EP2007/050736
§ 371 (c)(1),
(2), (4) Date: Jul. 28, 2008

(87) PCT Pub. No.: WO2007/085633
PCT Pub. Date: Aug. 2, 2007

(65) Prior Publication Data
US 2009/0001983 A1    Jan. 1, 2009

(30) Foreign Application Priority Data
Jan. 27, 2006    (EP) .................................... 06100976

(51) Int. Cl.
*G01R 33/09*    (2006.01)
*H01L 43/08*    (2006.01)
(52) U.S. Cl. ...................................... 324/252; 338/32 R
(58) Field of Classification Search .................. 324/244, 324/249, 252, 207.21; 338/32 R; 360/324, 360/324.1, 324.11, 324.12, 324.2
See application file for complete search history.

(56) References Cited

U.S. PATENT DOCUMENTS

| | | | |
|---|---|---|---|
| 5,463,516 A | 10/1995 | Valet et al. | |
| 5,889,091 A | 3/1999 | Ziolo et al. | |
| 6,365,286 B1 | 4/2002 | Inomata et al. | |
| 2007/0018641 A1* | 1/2007 | Hayashi et al. | 324/249 |

FOREIGN PATENT DOCUMENTS

EP    0 911 892    4/1999

OTHER PUBLICATIONS

Varfolomeev et al: "Giant negative magnetoresistance in a composite system based on Fe304 nanocrystals in a polymer matrix" JETP Letters AIP USA, vol. 67, No. 1, Jan. 10, 1998, pp. 39-42, XP009066906; ISSN: 0021-3640; p. 39, line 11-p. 40, line 12.
Database WPI; Section Ch, Week 200026; Derwent Publications Ltd., London, 6B; AN 20000-293655; XP002383534.
Moon-Ho Jo et al: "Spin-and charge-modulated trilayer magnetic junctions: La0.7Ca0.3MnO3/La0.45Ca0.55MnO3/La0.7Ca0.3MnO3" Journal of Physics: Condensed Matter IOP Publishing UK, vol. 15, No. 30, Aug. 6, 2003, pp. 5243-5251, XP002382633; ISSN: 0953-8984.

(Continued)

*Primary Examiner* — Kenneth J Whittington
(74) *Attorney, Agent, or Firm* — Cantor Colburn LLP (57) ABSTRACT

A magnetic field sensing element includes a pair of electrodes; a dielectric polymer layer separating the electrodes; and a network of magnetic nanoparticles in the insulating layer forming a current flow path between the electrodes; where the network of magnetic nanoparticles includes at least one magnetic tunnel junction involving two neighbouring nanoparticles of different coercivity.

19 Claims, 3 Drawing Sheets

OTHER PUBLICATIONS

Schelp et al: "Spin-dependent tunneling with Coulomb blockade" Physical Review B (Condensed Matter) APS Through AIP USA, vol. 56, No. 10, Sep. 1, 1997, pp. R5747-R5750, XP002382634; ISSN: 0163-1829.

Park et al: "Magnetoresistance of Mn: Ge ferromagnetic nanoclusters in a diluted magnetic semiconductor matrix" Applied Physics Letters, AIP, American Institute of Physics, Melville, NY, US, vol. 78, No. 18, Apr. 30, 2001, pp. 2739-2741, XP012027895; ISSN: 0003-6951.

Mitani et al: "Tunnel-MR and spin electronics in metal-nonmetal granular systems" Journal of Magnetism and Materials Elsevier Netherlands, vol. 198-199, Jun. 1999, pp. 179-184, XP002382635; ISSN: 0304-8853.

International Search Report; PCT/EP2007/050736; Apr. 10, 2007.

D. Yu Godovsky et al.; "Magnetic Properties of Polyvinyl Alcohol-based Composites Containing Iron Oxide Nanoparticles" Advanced Materials for Optics and Electronics 9, pp. 87-93 (1999).

* cited by examiner

MAGNETIC FIELD SENSING ELEMENT HAVING MAGNETIC NANOPARTICLES

TECHNICAL FIELD OF THE INVENTION

The invention generally relates to a magnetic field sensing element. More precisely, it relates to a magnetic field sensing element which utilizes the phenomenon of tunneling magneto resistance.

BRIEF DISCUSSION OF RELATED ART

Today, numerous kinds of magnetic field sensors are available. They differ in the technology on which they are based, which often also depends on the field of application.

The most conventional electromechanical magnetic field sensors are based on the induction principle. They use inductive coils and can only detect a time dependent magnetic field.

For application in the automotive industry for example, magnetic field sensors have been developed that allow detecting and measuring of the presence, the strength and/or variations of magnetic fields. The predominant technologies used in such sensors are based on the well known Hall-effect and the magneto resistive effect. These technologies conventionally involve semiconductor techniques. The sensing element and electronics are placed on a common chip. Alternative techniques, mainly for detection of rotation, apply the exchange bias effect of a ferromagnetic and an antiferromagnetic layer which are in direct contact.

For applications in the field of Information Technology (IT), such as e.g. read heads, storage technology, magnetic random access memory (MRAM), there is a general trend to reach a higher level of miniaturization, e.g. to increase storage density.

Recently, read heads of hard disks based on the giant magneto resistance (GMR) effect have been developed, wherein hard and soft magnetic layers are separated by a metallic non-magnetic layer.

Furthermore, so-called magnetic tunnel junctions (MTJs) have aroused considerable interest due to their applicability in spin-electronic devices such as MRAMs and magnetic sensors. Typically, a MTJ consists of two ferromagnetic metal layers separated by a thin insulating barrier layer. The insulating layer is so thin that the electrons can tunnel through the barrier as a bias voltage is applied between the two metal electrodes across the insulator. In such MTJ, the tunneling current depends on the relative orientation of the magnetizations of the two ferromagnetic layers, which can be changed by an applied magnetic field. This phenomenon is called tunneling magnetoresistance (TMR).

A hard-disk reading head featuring a magnetic-field sensor based on the TMR effect is for example described in U.S. Pat. No. 6,219,274.

Although these technologies based on effects at the nano-scale can today be implemented at industrial level, they require sophisticated thin film technology, which involves high cost design and equipment. In addition, despite their large range of possibilities to determine the presence, range and direction of a magnetic field, this is only possible at the position where the sensing element is located. Measuring a magnetic field in an extended spatial region would require either the employment of multiple sensors of such type or the mechanical movement of a sensor between several measurement positions.

U.S. Pat. No. 5,463,516 discloses a magnetoresistive transducer operating on the TMR principle, comprising MTJ formed between alternating layers of hard and soft magnetic particles arranged in an insulating or semiconductor matrix (such as $SiO_2$, $Al_2O_3$, C, Si, Ge etc.). Again, this transducer requires sophisticated and expensive thin film technology, and its functionality is limited by its deterministic construction which closely relates the physical properties of the nanoparticles with their preparation conditions and the sensor build-up.

BRIEF SUMMARY OF THE INVENTION

The invention provides an alternative magnetic field sensor that also involves solid state effects at the nanometer scale, and that is easier and cheaper to manufacture.

DETAILED DESCRIPTION OF THE INVENTION

In order to overcome the above-mentioned problem, the present invention provides a magnetic field sensing element comprising a pair of electrodes separated by an insulating (dielectric) polymer layer. Inside the insulating layer, magnetic nanoparticles are arranged in a network in such a way as to provide a current flow path between the electrodes. The network of magnetic nanoparticles comprises at least one magnetic tunnel junction (MTJ) involving two neighbouring nanoparticles having different coercivity.

The present magnetic field sensing element thus uses MTJs that are built inside the insulating layer from two neighbouring nanoparticles. When a voltage is applied between the electrodes, charge carriers are transported from one electrode to the other via the network of nanoparticles. The difference in coercivity permits to obtain variations in the angle of magnetization between the two nanoparticles in the junction when an external magnetic field is applied, which causes a variation of tunneling magneto resistance (TMR) through the junction. Monitoring of the current and/or voltage between the electrodes thus permits to determine variations in magnetic field in the vicinity of the sensing element.

It shall be noted that the magnetic field sensor according to the present invention can be used to measure the presence of a magnetic field. It can also be used to measure the amplitude of a magnetic field or to distinguish between the directions of rotation of a magnetic field. The present sensors rely on a cost economic technology employing inexpensive raw materials and can be manufactured by well known, cost economic processes such as e.g. screen, inkjet, offset, gravure, flexo or pad printing (as will be explained below).

The term magnetic nanoparticle herein designates particles in the nanometer size range and comprising (ferro)magnetic material. There is no particular limitation on the shape of the particles, although they may typically have a generally spherical shape. With respect to their size, the magnetic particles may have a geometrical extension equal or smaller than 200 nanometers in two spatial dimensions. Their size is not restricted in the third dimension (which may reach up to several hundreds manometers), thus they may be nanospheres, nanotubes, nanorods or nanowires.

It will be understood that in practice, the insulating layer will comprise a large amount of nanoparticles and thus include a considerable number of MTJs throughout the insulating layer. This is a completely different design approach of a magnetic sensor since the sensitivity and performance of the present sensing element is based on the statistical distribution of the various MTJs and their associated physical properties in the network, whereas in conventional magnetic sensors there is a precise, deterministic construction of the MTJ.

Due to the wide range of possible particle sizes and geometries, the particle concentration may also vary in a wide range. Hence, the particle concentration in the insulating polymer layer may be in the range from 1 to 60 vol. %.

The dielectric tunnel barrier of the MTJ may take several forms. The first possibility is that a certain thickness of the insulating layer (matrix) itself separates the two nanoparticles of the junction and thereby acts as a tunnel barrier. Another possibility is to provide nanoparticles with a core/shell structure, where the core consists of the magnetic material and the shell acts as tunnel barrier. In such a case, only one type of nanoparticles is normally provided with a shell acting as tunnel barrier. The shell may consist of an oxide layer or another dielectric coating, e.g. polymer. The shell may also consist of an anti-ferromagnetic material.

In a preferred embodiment, only two types of magnetic nanoparticles are used: one exhibiting a fixed magnetization and the other a free magnetization. This means that one type of particles should have a strong (or fixed) magnetization (due to hard magnetic properties) so that it cannot be reversed by the external field, while the other type of nanoparticles have a "free" magnetization (due to soft magnetic properties—at least with regard to the particles with strong magnetization) that is allowed to rotate (and reverse) when an external field is applied. The probability of the charge carriers to tunnel across a barrier between soft and hard magnetic particles depends on the directions of nanoparticle magnetization with respect to another. Applying an external magnetic field changes the magnetization of the soft particles and thus leads typically to a minimum in resistance of the whole nanoparticle arrangement if the magnetization of all particles is parallel, and typically to a maximum in resistance if the magnetization of soft and hard nanoparticles is anti-parallel. The change in sensor TMR due to an applied external magnetic field is measured thus allowing to test for the presence of a field as well as measuring its amplitude or direction.

The fixed magnetization of nanoparticles can be obtained by using hard magnetic material, typically ferromagnetic material with a large coercitive field. Examples of such materials are: FePt, FePd, SmCo or CoPt.

Regarding the soft nanoparticles that exhibit free magnetization, they may typically comprise soft magnetic material, i.e. a material with a low intrinsic coercivity, such as e.g. soft ferromagnetic material like Fe, Ni, Co or alloys thereof. Alternatively, nanoparticles exhibiting soft magnetic properties can be obtained by using a material that will behave superparamagnetic at the operating temperature, i.e. the temperature should be higher than the blocking temperature for that nanoparticle. When exceeding the blocking temperature of a magnetic nanoparticle, the particle looses its permanent magnetic dipole moment and its coercitive field diminishes. The ferromagnetic order is lost, it behaves super-paramagnetic. Hence, if an external magnetic field is applied, the magnetic moment of the particle follows the external field and a magnetic dipole moment is induced in the particle by the external field. In this sense a super-paramagnetic particle possesses exactly the desired soft magnetic properties.

Depending on the materials and desired design, one may use nanoparticles that possess uniaxial, unidirectional or multi-axial anisotropies or combinations thereof. In another embodiment, some nanoparticles may be amorphous, thus lacking the existence of an easy axis of magnetization.

Preferably, the particles are single magnetic domain nanoparticles, whereby there is only one magnetic vector per particle. The behaviour of such particles is more predictable, the remagnetization principle is more easy to control, so that the properties of the sensor can be better tailored.

Preferably materials are used whose spin polarization of the majority carriers at room temperature at the Fermi level is as large as possible. They shall possess an uniaxial magnetic anisotropy thus exhibiting a magnetic easy axis.

In a further embodiment, one or all types of nanoparticles possess a high magneto resistance and a half-metallic band-structure in order to achieve a high spin polarization of the majority carriers at the Fermi level. Examples for such type of nanoparticles are so-called Heusler alloys of structure $X_2YZ$ or $XYZ$ where $X$ and $Y$ denote transition metal elements and $Z$ denotes a group III, IV, or V element. Material examples of a Heusler alloy are $CO_2MnSi$ or $CO_2FeSi$. Another example of a material with high spin polarization are ferromagnetic oxides such as $Fe_3O_4$ or $CrO_2$.

Yet in another embodiment, the soft nanoparticles, the hard nanoparticles, or both are not magnetic single domain particles.

It is to be noted that some polymers may have intrinsic magnetic properties. As a matter of fact, there are some organic molecules which show a ferromagnetic response by construction of their molecules. This means a polymer with such molecules has, per se, a ferromagnetic behaviour (one could speak of inherent magnetic properties). Building a MTJ with such polymer thus only requires adding magnetic nanoparticles which are softer or harder than the magnetic polymer. To provide a current flow path between the electrodes, the polymer shall have at least some electrical conductivity. The tunneling barrier between the nanoparticles and the magnetic molecules (or entities) in the polymer can be formed by providing an external insulating coating on the magnetic nanoparticles (core/shell structure, e.g. the natural oxide layer of the magnetic metal/alloy). Compared to the magnetic sensing element according to the previous aspect of the invention, a higher concentration (volume fraction) of the magnetic nanoparticles in the polymer is preferable.

Therefore, according to another aspect of the present invention, a magnetic field sensing element comprises: a pair of electrodes; a polymer layer separating the electrodes; and magnetic nanoparticles in the polymer layer. The polymer layer has intrinsic magnetic properties (magnetic molecules) and electrical conductivity. The magnetic nanoparticles have a magnetic coercivity different from the polymer and are provided with a coating acting as barrier layer, whereby magnetic tunnel junctions are formed in the current flow path between the electrodes.

According to a further aspect of the invention, a process for manufacturing a magnetic field sensing element is proposed, the process comprising:
  providing a substrate;
  providing a liquid mixture comprising insulating polymer and/or insulating polymer precursors, and nanoparticles having different coercivity;
  forming a layer of said liquid mixture onto said substrate and causing it to solidify, so as to form a layer of insulating polymer containing the nanoparticles;
  forming first and second electrodes in such a way that they are separated by the layer of insulating polymer containing the magnetic nanoparticles.

The present method is relatively easy to implement and may require only relatively simple and economic techniques. The formation of the magnetic field sensitive layer, i.e. the polymer layer with embedded nanoparticles is obtained by solidification/curing of the liquid mixture containing polymer precursors and the nanoparticles. For operation of the sensor, it suffices to provide electrodes on both sides of the layer. Depending on the structure and design of the sensing element which is to be realised, the electrodes may be formed at different moments, simultaneously or separately. The contact resistance at the interface between the insulating polymer layer and the electrodes should preferably be as low as possible. Therefore, the electrode manufacturing processes should be chosen accordingly: printing, sputtering, evaporation or gas phase deposition methods in general are possible techniques. As is known, printing techniques are cheap and easy manufacturing techniques. Also to reduce interface ohmic resistance, the electrodes may be made from metallic or nanocomposite materials.

In a preferred embodiment, an external field is generated in the vicinity of the mixture layer while still in the liquid state to control the arrangement of said nanoparticles and/or the orientation of magnetization of said nanoparticles. Such external field may be one of a D.C. electric field, a magnetic field or an electromagnetic field, which may allow to arrange the network of nanoparticles to form structures such as chains, colloidal crystals, symmetrical patterns, or clusters. Of main interest is a DC magnetic field; however, since some particles may also exhibit a permanent or an induced electrical dipole moment the D.C. or time-dependent electric fields can be used. Hence, the nanoparticles arrange themselves in such a field in a way that their magnetic moments are aligned essentially parallel to the field, which greatly simplifies the implementation of the process.

It may be noted that the production of the network of nanoparticles in the insulating polymer is surprisingly simple. The process can be best described by field assisted self-organization. A necessary condition for such a process is a sufficiently high mobility of the nanoparticles. In the liquid polymer matrix this condition is fulfilled in an elegant way. Mobility is in general high enough and may additionally controlled by adaption of the rheological properties of the liquid matrix. Field assisted self-organization occurs due to the permanent magnetic dipole field of magnetic nanoparticles. Dipole-dipole interaction of neighboring particles leads to the formation of chains of nanoparticles in which their magnetic easy axis is also oriented in direction of the chain. In one embodiment, in order to orient the chains perpendicularly to the electrodes an external magnetic field is superimposed to the localized dipole fields. Such an external field is also helpful in case that a nanoparticle does not possess a permanent dipole moment (a superparamagnetic particle, e.g.) so that a sufficiently high particle magnetic moment can be induced by the external field. Since the whole chain formation process depends on the initial boundary conditions and is affected by statistical fluctuations, nanoparticle chains are in general not straight but they tend to form a network of chains with a preferred chain orientation perpendicular to the electrodes and with a number of knots and crosslinks between the more or less parallel chains. After network formation the liquid polymer matrix is caused to solidify thus fixing the geometrical arrangement of nanoparticles in the matrix.

The present method thus allows orienting the nanoparticles by applying an external field, e.g. to orient chains to reach from one electrode to the other. Hence, by contrast to conventional techniques, the geometry and orientation of the nanoparticles does not need to be necessarily of the parallel, planar configuration. Besides, the external field permits inducing a dipole moment in particles that do not have a permanent dipole (useful when using super-paramagnetic material), so that these particles behave as desired.

The solidification process of the mixture depends on the nature of polymeric material, which may typically be an insulating polymer in liquid form or a solution of polymer precursors that need to be polymerized. In practice, the solidified insulating polymer layer containing the nanoparticles may be made from thermosetting or thermoplastic polymer (which shall typically be electrically insulating, i.e. dielectric, and non-magnetic). Polyester-, polyolefin, hydrocarbon-, and siliconbased polymers are examples of thermosetting polymers. A phenolic-based polymer is an example of a thermoplastic polymer.

In case the mixture comprises insulating polymers, the latter may be dissolved in a solvent to allow their use in liquid form or can be a thermoplastic polymer in liquid state. The solidification and curing step may therefore imply drying (evaporating) of the solvent and/or cooling.

In case polymer precursors (typically monomers of the desired polymer) are used, the solidification of the mixture will imply the polymerization of the precursors. The polymerization type and kinetics will depend on the nature of the polymer precursor. Hence, depending on the liquid mixture, UV curing, hot air curing, infrared curing or chemical processes can be used to cause the solidification of the polymer layer. Acrylate- or epoxy-based oligomers are examples of photopolymerizable polymers.

It remains to be noted that nanoparticle network formation may alternatively be achieved by using a liquid mixture comprising the nanoparticles and a combination of two or more polymers. For example, in case of so-called diblock-copolymers, the liquid mixture may comprise two polymers or resp. two types of oligomers mixed together, of course also with the nanoparticles. At a critical temperature (or at a critical UV dose) a phase separation between the two materials occurs, typically forming characteristic patterns consisting of alternating regions in which either one or the other polymer type is located. Depending on their surface properties, nanoparticles may have an affinity to one or the other polymer type. According to such preparation procedure, the nanoparticles will be contained mainly in the high-affinity polymer type. Thus the nanoparticle density reflects the spatial pattern that forms due to the phase separation of the polymers. This pattern may be helpful for the creation of conductive paths through the insulating polymer since the nanoparticle density is high in the high-affinity polymer and low in the low-affinity polymer.

The magnetic field sensor according to the present invention can be used to measure the presence of a magnetic field. Further applications are the measurement of the amplitude of a magnetic field or to distinguish between the directions of rotation of a magnetic field.

In the case of detection of the presence of a magnetic field, it may be noted that the production technique is advantageous in that it allows to fabricate numerous sensing units on a common substrate and to connect all sensing elements to an electronic circuit which generates a signal output according to, e.g., automotive standards. All sensing elements are addressed individually by the electronics. The connectors between the sensing elements and electronics, and optionally additional active or passive electronic elements, can be fabricated on the same substrate as the sensing elements.

More generally, those skilled in the art will appreciate that the present technology allows producing very large sensors by arranging a multitude of magnetic field sensing elements on one substrate using large-scale, large-area production techniques.

A particular application of the present sensor technology is, e.g., the measurement of the position of a front seat in an automobile. A sensor unit comprising a polymer substrate and a plurality of sensing elements fabricated thereon is prepared. This sensor unit is mounted at one side in the fixed guide bar of the seat fixation, which itself is fixed at the automobile chassis. A small permanent magnet is mounted in the slide bar (counterpart of the guide bar), which is fixed at the seat.

Moving the seat forward or backward changes the relative position between the guide bar and its slide bar counterpart at the seat. If the permanent magnet is opposite of a sensing element, the magnetization in this particular element switches accompanied by a change in magnetoresistance in that element. This different value in magnetoresistance is detected by the electronics and is assigned to the sensing element whose magnetization was switched. Since the position of this sensing element with respect to the chassis is known, the position of the seat with respect to the chassis is also known immediately. It will be understood that the described working principle requires a sufficiently high number of sensing elements on the substrate with corresponding individual addressing of the sensing elements by the electronics. Both requirements are accomplished elegantly by the present sensor technology.

A number of non-automotive applications are also possible. The present sensor technology is of special advantage for employment where a number of sensing positions have to be measured with medium lateral resolution. The sensors as well as their connectors to the electronics can all be fabricated on one substrate. Polymer foil substrates are particularly preferred for the fabrication of such sensors. The sensor unit as a whole may possess several meters in length and it may carry several hundreds of magnetic sensing elements according to the present invention.

BRIEF DESCRIPTION OF THE DRAWINGS

The present invention will now be described, by way of example, with reference to the accompanying drawings, in which.

DETAILED DESCRIPTION OF PREFERRED EMBODIMENTS

Nanotechnology is a rapidly growing field in science and industry. Particles of nanometer size and of desired structural properties are today commercially available. The surface of these particles can be relatively easily modified or even functionalized in order to enable particle dispersion in a polymeric solution or to prevent aggregation. This emerging technique of preparation and utilization of nanoparticles allows for completely new approaches in exploiting physical effects on the nanometer scale and for constructing new products such as sensors.

The present invention utilizes certain types of (ferro)magnetic nanoparticles which can be dispersed in liquids containing polymers or precursors of polymers. The strength of this approach is that such dispersions can be brought onto substrates in a low-cost industrial process as by printing, e.g. Such a technique allows for the preparation of sensor elements of well defined geometrical extension on a large scale. In particular it is easily possible to produce these sensor elements, including the electronic architecture necessary to operate the sensor elements, on flexible substrate, e.g. on polymer films, and from roll to roll.

The production of the network of nanoparticles in the insulating polymer layer is surprisingly simple and follows a statistical approach instead of the deterministic approaches used in today's magnetoelectronics. Usually a commercially available tunneling magneto resistance (TMR) read head consists of a certain number (typically four) TMR junctions which are prepared from the gasphase. This redundancy in TMR junctions is necessary because a single TMR junction may not work properly mainly due to possible short-cuts between the ferromagnetic layers typically caused by pinholes in the extremely thin tunneling barrier. The present invention overcomes this way of preparation by creating numerous TMR junctions whose number per sensor element is several orders of magnitude greater than in the described deterministic preparation technique. Thus the failure of a few TMR junctions is not critical for the correct operation of the sensor element. The TMR effect of the sensor cell is the result of the statistics of spin dependent scattering processes in a huge number of TMR junctions. This makes the sensor technology of the invention much more robust in view of the production process. In the present process the number fraction of soft and hard (ferro)magnetic particles can be varied so that the TMR effect of the sensor cell is at maximum and so that the network resistance lies within the desired range. In practice this means that the network of particles will have at least one TMR junction in each branch of the network. However the TMR effect of a sensor cell will be caused by a statistical distribution of TMR junctions that are effective in the conductive network. The average number of TMR junctions being effective in each conductive path of the network will be higher than one in order to avoid percolative paths without TMR junction.

During the particle dispersion, in the printing process, and in the final polymer solidification the intrinsic particle properties are not altered. This means that the particles' crystallographic structure or their size distribution remain essentially unaffected by the sensor production process. Thus the processes of particle synthesis and sensor production are completely separated. This is extremely beneficial because it warrants the maximum freedom in the choice of materials, in designing the particles properties, and the geometrical arrangement of particles. The sensor manufacturing technology of the invention is namely particularly advantageous over the convention technique as described in U.S. Pat. No. 5,463, 516, which illustrates the typical limitations of the prior art in the choice of materials, particle properties, and geometrical arrangement of particles because the processes of particle and of sensor production are not separated.

Figure 1:
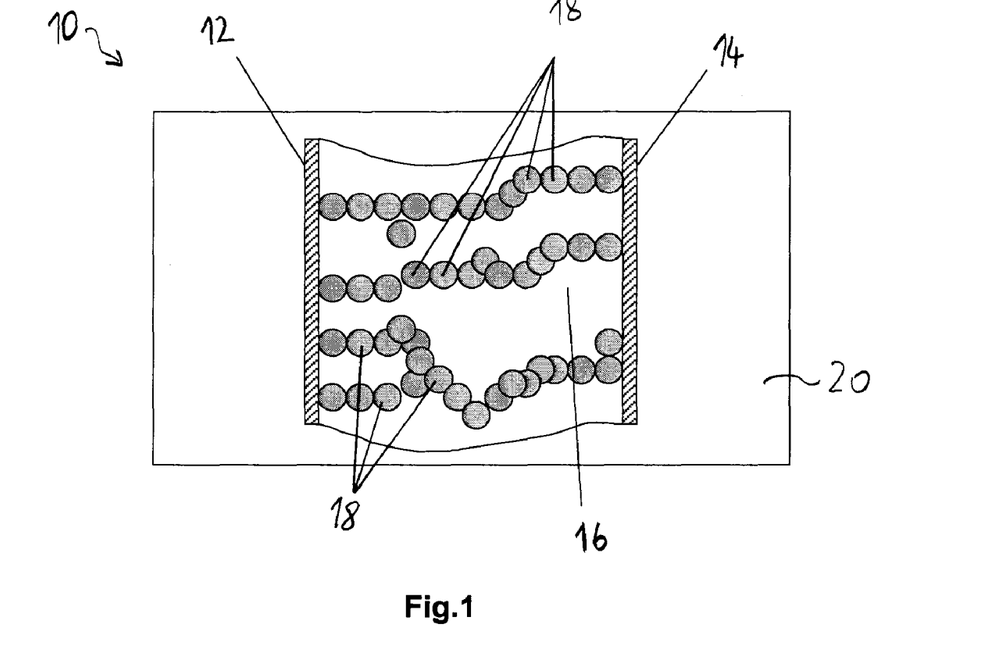
FIG. 1: is a section view, along a plane parallel to the substrate, through a first embodiment of a magnetic field sensing element according to the invention.

A first embodiment of a field sensing element 10 according to the invention is illustrated on FIG. 1. It comprises a pair of electrodes 12 and 14 separated by a layer 16 (also referred to as matrix) of an electrically insulating polymer. Reference sign 18 indicates magnetic nanoparticles (nanoparticle) embedded in the polymer matrix 16. Such nanoparticles may have a size varying between a few nanometers, up to several hundreds of nanometers, however preferably not more than 200 nm in two of the three spatial dimensions. In different embodiments their shape may vary. For ease of representation, the nanoparticles 18 are depicted in the same style, being spherical and of the same size. In particular the drawings of FIGS. 1 and 2 do not consider their different magnetic properties, their magnetization, nor their potentially different sizes and geometrical shapes.

The magnetic nanoparticles 18 are arranged in the polymer matrix 16 so as to form a network providing a current flow path between the electrodes 12, 14. As can be seen, the nanoparticles 18 are arranged in intimate contact to another in one or in multiple chains, or in a three-dimensional network where chains consisting of nanoparticles are allowed to be cross linked. It will be understood that the electrodes 12, 14 must be connected by at least one chain of nanoparticles 18 so that a current path from one electrode to the other may exist. It is also clear that the nanoparticles must have some electrical conductivity for the current to flow through a chain. It is considered that for proper operation, the nanoparticles should preferably have a minimum electrical conductivity of 1 S/cm.

Although not shown in FIG. 1, it is to be appreciated that the network of nanoparticles 18 comprises at least one magnetic tunnel junction involving two neighboring nanoparticles 18 having different coercivity. Such MTJ is sensitive to the external magnetic field, which will cause a variation of magnetization of the type of nanoparticles having the lowest coercivity. This will modify the tunneling magneto resistance of the MTJ and thereby cause a variation of the current flowing from one electrode to the other. In practice, the electrodes 12, 14 may be connected to an electrical circuit in which the D.C. current or the voltage can be defined and the respective quantity that is not defined can be measured.

In FIG. 1, the sensing element 10 has a plane structure. The electrodes 12, 14 and insulating polymer layer 16 are formed directly on the surface of the substrate 20, next to another. When a difference of potential is applied between the electrodes 12, 14, an electrical field is created essentially perpendicular to the surface normal of the substrate. The nanoparticles 18 are arranged in chains or cross-linked chains reaching from one electrode to the other so that charge carriers will move between the electrodes 12, 14 as soon as a voltage is applied there between.

Figure 2:
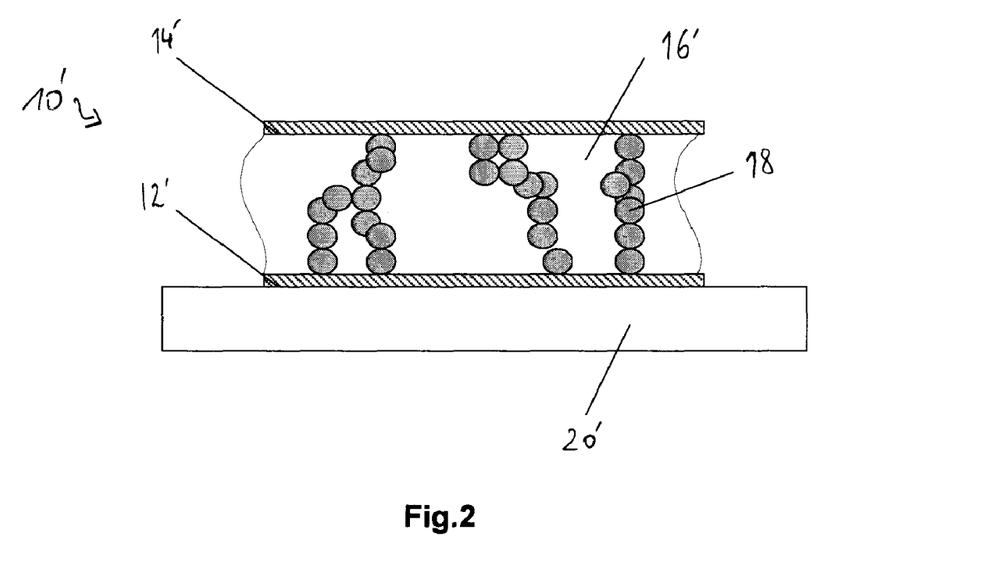
FIG. 2: is a section view, along a plane perpendicular to the substrate surface, through a second embodiment of a magnetic field sensing element according to the invention.

FIG. 2 shows another embodiment of a sensing element 10' in accordance with the invention where the electrodes 12' and 14' and insulating layer 16' are arranged on top of another on the surface of the substrate 20'. When a difference of potential is applied between the electrodes, an electrical field is created essentially parallel to the surface normal of the substrate 20'.

In both preferred embodiments of FIGS. 1 and 2, the network of nanoparticles consists of chains extending substantially perpendicularly to the electrodes 12, 14. A preferred way of manufacturing such sensing elements will be explained in detail further below.

As has already been explained, the sensor working principle is based on the interaction of charge carriers in an electric circuit with magnetic nanoparticles of different magnetic properties. The tunneling magneto resistance (TMR) of an electrically insulating (dielectric) tunneling barrier that connects two nanoparticles depends on the relative orientation of nanoparticle magnetizations with respect to each other. TMR is minimal for parallel orientation and maximal for anti-parallel orientation, as is well known.

In order to achieve a reversal of magnetization of a certain number of nanoparticles in an external magnetic field—the field which presence is to be detected—some of the nanoparticles shall have a "free" magnetization. However, the magnetization of all other nanoparticles must not be reversed in the presence of an external field, which requires the use of nanoparticles having a "fixed" magnetization. In the present embodiments, the nanoparticles having free magnetization are made from material having soft magnetic properties, whereas the nanoparticles having fixed magnetization are made from material having hard magnetic properties. Soft (resp. hard) magnetic properties means that the coercive field of the respective nanoparticles is small (resp. large) in relation to the external field to be measured. The magnetic properties of nanoparticles in general depend on the intrinsic material properties as well as on the nanoparticles' size, geometry, temperature, and environment. As will be understood by those skilled in the art, the type of magnetism evoked above for the nanoparticles, whether hard or soft, is ferromagnetism.

For simplicity and homogeneity, the same soft magnetic material can be used for the soft nanoparticles and the same hard magnetic material can be used for the hard magnetic nanoparticles.

An MTJ of course requires an insulating (dielectric) tunnel barrier at the interface between the two nanoparticles from which the MTJ is to be formed. Such tunnel barrier may take several forms. It may for example consist of a thin portion of the polymer matrix itself separating the two nanoparticles. However, since the nanoparticles are to be arranged in intimate contact and spacing between them may be difficult to control, the barrier layer between the two nanoparticles of a MTJ shall preferably take the form of a coating (or shell) of dielectric barrier material provided on one type of the nanoparticles. This permits to have barrier layers between soft and hard nanoparticles and avoid them between nanoparticles of the same type. It also results in a reduced resistance of the interface between adjoining nanoparticles of the same type, which is distinctly lower than the TMR between a hard and a soft nanoparticle. Furthermore, when a soft nanoparticle is sandwiched between two hard nanoparticles or when a hard nanoparticle is sandwiches between two soft nanoparticles, a TMR double junction is directly obtained.

The dielectric barrier material acting as tunnel barrier may comprise anti-ferromagnetic material, e.g. a natural oxide of the metal/alloy forming the nanoparticle.

Figure 3:
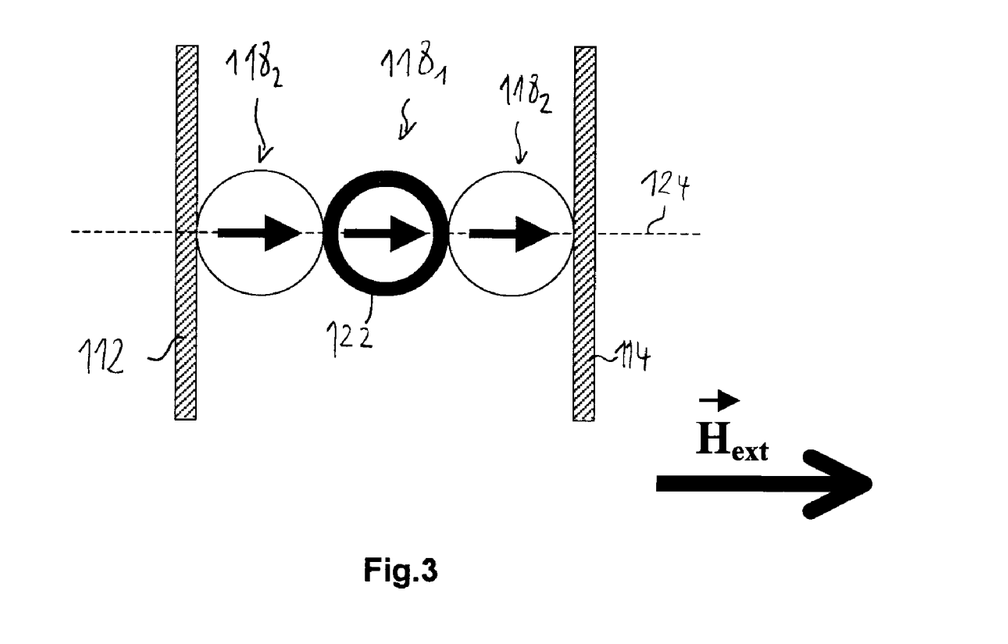
FIGS. 3, 4 and 5 are sketches illustrating the working principle of the present magnetic field sensing element based on an exemplary embodiment featuring 3 nanoparticles.
Figure 4:
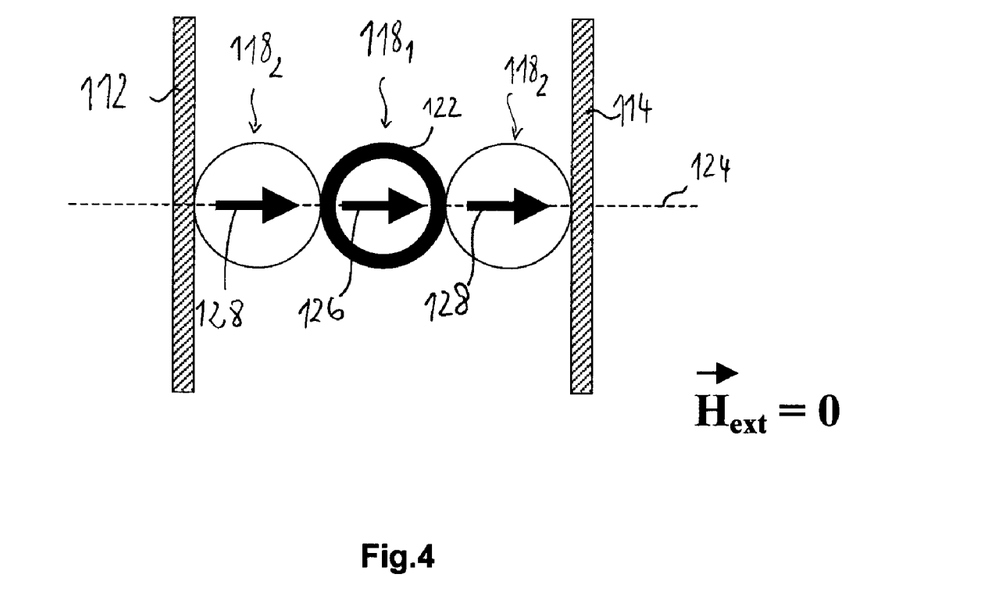
Figure 5:
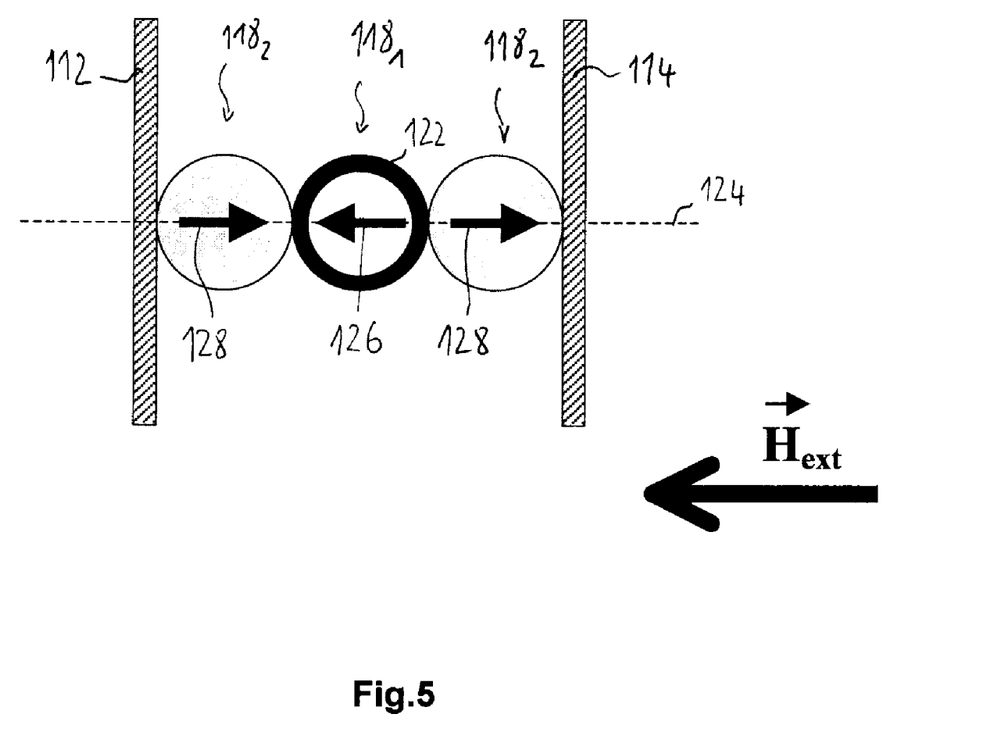

In order to illustrate the general working principle of the present sensing element without referring to a particular embodiment, FIGS. 3, 4, and 5 show an exemplary arrangement of one chain consisting of three nanoparticles 118 between two electrodes 112, 114 in an electrically insulating matrix (not shown). A soft magnetic nanoparticle $118_1$ is positioned between hard magnetic nanoparticles $118_2$ to make up a chain. Hard $118_2$ and soft $118_1$ magnetic nanoparticles are separated by a dielectric tunneling barrier 122, thin enough, so that after application of an electric field between the electrodes 112, 114 a permeation of spin polarized charge carriers through the barrier 122 is likely. The easy axes of magnetization, indicated by the dotted line 124 are parallel to the chain axis and lead to a stable minimum in magnetization energy of the hard particles $118_2$ if the external magnetic field, $H_{ext}$, is parallel or antiparallel to the chain axis 124 and the field amplitude is smaller than the coercitive field of the hard nanoparticles $118_2$.

FIG. 3 shows the situation where the magnetization vectors, 128 and 126 of the hard and the soft nanoparticles respectively, are collinear with the external magnetic field, $H_{ext}$. FIG. 4 shows the situation where the external field as was shown in FIG. 3, $H_{ext}$, is switched off. Essentially due to dipole-dipole interaction between adjoining nanoparticles 118 the magnetization vector 126 of the soft nanoparticle $118_1$ will be parallel to the magnetization vectors 128 of the hard nanoparticles $118_2$. This state is thermodynamically stable at room temperature. FIG. 5 illustrates the switched magnetization state 126 of the soft nanoparticles $118_1$ if the orientation of the external field $H_{ext}$ is reversed in comparison to the situation depicted in FIG. 3. For such operation, the amplitude of the external field must be sufficiently high to reverse the magnetization 126 of the soft nanoparticle $118_1$, however lower than the coercitive field of the hard nanoparticles $118_2$ to prevent a reversal of their magnetization 128. If the external field in FIG. 5 is switched off the magnetization state becomes thermo-dynamically unstable. It will return to the stable state depicted in FIG. 4.

The present sensing elements measure the presence of an external magnetic field oriented in a defined direction and of an amplitude in a certain interval by a change in electrical resistance of the circuit. If the field amplitude is known the sensor can be used to measure the direction of the external field within a plane. Since the hysteresis curve of the soft nanoparticles is biased due to the interaction with the magnetization of the hard nanoparticles, the switching of the soft nanoparticles, and consequently the current-voltage-curve, is not symmetrical with respect to the zero-field position thus allowing one to distinguish between the directions of a field rotation.

The manufacturing of the present sensing elements will now be explained in detail.

As it will appear, the present sensing elements can be manufactured using conventional technologies at relatively low costs.

Generally, the soft and hard nanoparticles are added, in a selected number ratio to a solution of insulating polymer or polymer precursors to obtain a liquid mixture. This mixture is applied onto a substrate in the form of a layer. This layer is then subjected to an external magnetic field which applies a torque at the nanoparticles. Due to energy minimization they will rotate and their easy-axes will be aligned parallel to the field, in case single domain nanoparticles with uni-axial anisotropy are used. The mobility of the nanoparticles in the liquid mixture is high enough so that they arrange in chains or in three-dimensional networks in order to reach a minimum in free energy if the system parameters are properly chosen. Such self-assembly mechanism has also been observed to lead to the formation of nanoparticle three-dimensional networks; networks having comparable geometrical configurations have also been described in the literature. After the network formation is completed the polymer is caused to cure and/or solidify, thus fixing the network structure in a solid non-conductive matrix. Of course, the solidification step depends on the nature of the polymeric mixture, as already explained. Those skilled in the art will easily determine suitable polymers or polymer precursors as well their solidification process.

It will be noted that the formation of the electrodes depends on the structure of the sensing element and on the manufacturing technology. For improved performance, the contact at the interface between the insulating polymer layer and the electrodes should preferably be as low as possible. This should therefore be kept in mind when selecting the electrode manufacturing process; printing, sputtering or gas phase deposition in general are possible technique. Printing techniques are cheap and easy manufacturing techniques and can be used for both magnetic sensitive layer and electrode manufacturing. Of particular interest are the techniques of screen, inkjet, offset, gravure, flexo or pad printing. Also to reduce interface ohmic resistance, the electrodes may be made from metallic or nanocomposite materials.

The sensing elements illustrated in FIGS. 1 and 2 can e.g. be manufactured using the techniques of screen printing, inkjet printing, offset, gravure, flexo or pad printing, conventionally used for forming electric circuits with conductive ink.

In the case of FIG. 1, where the sensing element 10 has a planar structure, the two electrodes 12, 14 may e.g. be printed on the substrate 20 using silver ink. The liquid mixture 16 of polymer precursor and nanoparticles is then printed on the substrate in-between the two electrodes 12 and 14. The width of the printed mixture strip is advantageously selected in such a way to slightly overlap the electrodes 12, 14 so as to ensure proper contact between the matrix 16 and the electrodes.

For the manufacture of the sensing element of FIG. 2, the lower electrode 12' is first printed on the substrate 20' and the liquid mixture is then printed thereon. Upon curing of the insulating layer 16', the second electrode 14' is then printed on the upper surface of the insulating layer 16'.

In the presented manufacturing process, the sensing element is, initially, one-time exposed to a high field which magnetizes the hard nanoparticles to saturation. This field is essentially parallel to the easy axes of the hard nanoparticles which were oriented in the liquid matrix during the preparation process. The easy axes are parallel to the chain axes. The hard nanoparticles will retain their magnetization over the sensor lifetime whereas the direction of magnetization of the soft nanoparticles follows the external field (FIGS. 3-5) as soon as the interaction with the neighbouring hard TMR partners is overcome by the field amplitude.

The present method for producing a magnetic field sensing element using printing techniques thus appears extremely advantageous because of their low costs and susceptibility for industrial scale production. Particular advantages of the present method are:

the possibility of applying a torque on the nanoparticles in the liquid polymer via a magnetic field thus orienting their magnetic easy axes;
the possibility of applying external fields on the nanoparticles in the liquid polymer to assist their arrangement in chains and networks;
flexibility that allows various sensor geometries;
printing of large area sensor on flexible substrates;
theoretically need only one MTJ per network branch;
the possibility of varying the ratio between hard and soft nanoparticles (that is not possible with the technique of U.S. Pat. No. 5,463,516, e.g.).

The invention claimed is:

1. Magnetic field sensing element comprising:
a pair of electrodes;
an insulating polymer layer separating said electrodes;
a network of magnetic nanoparticles in said insulating polymer layer forming a current flow path between said electrodes, wherein said network of magnetic nanoparticles comprises at least one magnetic tunnel junction involving two neighbouring nanoparticles of different coercivity.

2. The magnetic field sensing element according to claim 1, wherein said magnetic tunnel junction comprises a magnetic nanoparticle having fixed magnetization and a magnetic nanoparticle having free magnetization.

3. The magnetic field sensing element according claim 1, wherein said sensing element has a tunneling magneto resistance that results from a statistical distribution of a multiplicity of magnetic tunnel junctions in said network.

4. The magnetic field sensing element according to claim 1, wherein said network of nanoparticles comprises one or more chains or cross-linked chains bridging between said electrodes.

5. The magnetic field sensing element according to claim 4, wherein said electrodes are substantially parallel and said chains or cross-linked chains of nanoparticles extend substantially perpendicularly to said electrodes.

6. The magnetic field sensing element according to claim 5, wherein said sensing element has a tunneling magneto resistance that results form a statistical distribution of a multiplicity of magnetic tunnel junctions in said network.

7. The magnetic field sensing element according to claim 5, wherein said magnetic nanoparticles have a magnetic easy axis oriented in a direction of said chains.

8. The magnetic field sensing element according to claim 1, wherein said magnetic nanoparticles essentially consist of soft magnetic nanoparticles and hard magnetic nanoparticles.

9. The magnetic field sensing element according to claim 8, wherein said nanoparticles are single domain magnetic particles.

10. The magnetic field sensing element according to claim 8, wherein each magnetic tunnel junction comprises a tunnel barrier, which is formed by a portion of said insulating layer or by an external layer provided on at least part of one of the nanoparticles in the junction.

11. The magnetic field sensing element according to claim 8, wherein soft magnetic nanoparticles are provided with an external layer acting as barrier layer.

12. The magnetic field sensing element according to claim 8, wherein hard magnetic nanoparticles are provided with an external layer acting as barrier layer.

13. The magnetic field sensing element according to claim 1, wherein each magnetic tunnel junction comprises a tunnel barrier, which is formed by a portion of said insulating layer or by an external layer provided on at least part of one of the nanoparticles in the junction.

14. The magnetic field sensing element according to claim 13, wherein said external layer acting as barrier layer comprises antiferromagnetic material.

15. The magnetic field sensing element according to claim 1, wherein said insulating polymer layer comprises one or more polymer materials.

16. The magnetic field sensing element according to claim 1, wherein said electrodes are made of non-magnetic material.

17. The magnetic field sensing element according to claim 1, wherein said electrodes are made of antiferromagnetic material.

18. A magnetic field sensor unit comprising a plurality of magnetic field sensing elements according to any one of claim 1, arranged on a same substrate.

19. A magnetic field sensing element comprising:
a pair of electrodes;
a polymer layer separating said electrodes;
magnetic nanoparticles in said polymer layer;
wherein said polymer layer has intrinsic magnetic properties and electric conductivity; and
wherein said magnetic nanoparticles have a magnetic coercivity different from said polymer and are provided with a coating acting as barrier layer, whereby magnetic tunnel junctions are formed in the current flow paths between the electrodes.

* * * * *